(12) United States Patent
Burd

(10) Patent No.: US 7,689,893 B1
(45) Date of Patent: *Mar. 30, 2010

(54) ITERATIVE REED-SOLOMON ERROR-CORRECTION DECODING

(75) Inventor: Gregory Burd, San Jose, CA (US)

(73) Assignee: Marvell International Ltd. (BM)

( * ) Notice: Subject to any disclaimer, the term of this patent is extended or adjusted under 35 U.S.C. 154(b) by 1 day.

This patent is subject to a terminal disclaimer.

(21) Appl. No.: 11/956,861

(22) Filed: Dec. 14, 2007

Related U.S. Application Data

(63) Continuation of application No. 11/006,381, filed on Dec. 7, 2004, now Pat. No. 7,328,395.

(60) Provisional application No. 60/561,810, filed on Apr. 13, 2004.

(51) Int. Cl.
*H03M 13/15* (2006.01)

(52) U.S. Cl. ..................................... 714/784

(58) Field of Classification Search ................. 714/784
See application file for complete search history.

(56) References Cited

U.S. PATENT DOCUMENTS

| | | | |
|---|---|---|---|
| 4,162,480 A | 7/1979 | Berlekamp | |
| 4,541,092 A | 9/1985 | Sako et al. | |
| 4,653,051 A | 3/1987 | Sugimura et al. | |
| 4,653,052 A | 3/1987 | Doi et al. | |
| 4,719,628 A | 1/1988 | Ozaki et al. | |
| 4,802,173 A | 1/1989 | Baggen | |
| 4,845,714 A | 7/1989 | Zook | |
| 4,972,416 A | 11/1990 | Nagai et al. | |
| 5,001,715 A | 3/1991 | Weng | |
| 5,099,482 A | 3/1992 | Cameron | |
| 5,357,526 A | 10/1994 | Jang et al. | |
| 5,373,511 A | 12/1994 | Veksler | |
| 5,450,421 A | 9/1995 | Joo et al. | |
| 5,452,310 A | 9/1995 | Arts | |
| 5,684,810 A | 11/1997 | Nakamura et al. | |
| 5,732,093 A | 3/1998 | Huang | |
| 6,047,395 A | 4/2000 | Zook | |
| 6,378,103 B1 | 4/2002 | Han | |
| 6,427,220 B1 * | 7/2002 | Vityaev | 714/781 |
| 6,560,747 B1 | 5/2003 | Weng | |
| 6,581,178 B1 | 6/2003 | Kondo | |
| 6,634,007 B1 | 10/2003 | Koetter et al. | |
| 6,654,926 B1 | 11/2003 | Raphaeli et al. | |
| 6,697,989 B1 | 2/2004 | Maeda et al. | |
| 6,708,208 B1 | 3/2004 | Philyaw | |
| 6,718,501 B1 | 4/2004 | Brody et al. | |

(Continued)

OTHER PUBLICATIONS

U.S. Appl. No. 09/901,507, filed Jul. 9, 2001, Wu et al.

(Continued)

*Primary Examiner*—Stephen M Baker

(57) ABSTRACT

Systems and methods are provided to correct errors occurring in a decision-codeword that is generated by a detector. A decoder determines whether errors in the decision-codeword are of a degree that exceeds the correction capability of a Reed-Solomon error-correction code. If they are, the decoder iteratively modifies the decision-codeword to reduce the number of errors therein. In each iteration, the decoder generates an error indicator using one or more error indicators from a previous iteration and uses the error indicator to perform error detection and correction operations.

24 Claims, 8 Drawing Sheets

U.S. PATENT DOCUMENTS

| | | |
|---|---|---|
| 6,718,505 B1 | 4/2004 | Kravtchenko et al. |
| 6,725,416 B2 | 4/2004 | Dadurian |
| 6,732,328 B1 | 5/2004 | McEwen et al. |
| 6,772,384 B1 | 8/2004 | Noguchi |
| 6,922,446 B1 | 7/2005 | Chouly et al. |
| 6,981,187 B1 | 12/2005 | Oh |
| 6,981,197 B2 * | 12/2005 | Liu et al. .................... 714/765 |
| 7,089,478 B2 | 8/2006 | Cummings et al. |
| 7,120,850 B2 | 10/2006 | Lehobey et al. |
| 7,131,052 B2 | 10/2006 | Hassner et al. |
| 7,181,669 B2 | 2/2007 | Shen et al. |
| 7,185,259 B2 | 2/2007 | Fujita et al. |
| 7,328,395 B1 * | 2/2008 | Burd .......................... 714/780 |
| 7,444,582 B1 * | 10/2008 | Au et al. ..................... 714/784 |
| 7,454,690 B1 * | 11/2008 | Au et al. ..................... 714/780 |
| 2001/0023495 A1 | 9/2001 | Chang et al. |
| 2002/0095638 A1 | 7/2002 | Weng et al. |
| 2002/0099996 A1 | 7/2002 | Demura et al. |
| 2003/0051201 A1 | 3/2003 | Brenna |
| 2003/0145274 A1 | 7/2003 | Hwang et al. |
| 2004/0078746 A1 | 4/2004 | Tanaka et al. |
| 2004/0194003 A1 | 9/2004 | Kwon |
| 2005/0022095 A1 | 1/2005 | Lee |
| 2005/0050425 A1 | 3/2005 | Matsuda et al. |
| 2005/0166126 A1 | 7/2005 | Muller et al. |
| 2005/0229069 A1 | 10/2005 | Hassner et al. |
| 2005/0257115 A1 | 11/2005 | Piret et al. |
| 2005/0283702 A1 | 12/2005 | Wu et al. |
| 2006/0174181 A1 | 8/2006 | Banks et al. |

OTHER PUBLICATIONS

U.S. Appl. No. 10/135,422, filed Apr. 26, 2002, Burd et al.
U.S. Appl. No. 10/313,651, filed Dec. 6, 2002, Burd et al.
R. Blahut, *Theory and Practice of Error Control Codes*, p. 267-272, 1983.
D. Chase, "A Class of Algorithms for Decoding Block Codes with Channel Measurement Information," *IEEE Trans. Infor. Theory*, vol. IT-18, No. 1, Jan. 1972, pp. 170-182.
G.D. Forney, Jr., "Generalized Minimum Distance Decoding," *IEEE Trans. Infor. Theory*, vol. IT-12, No. 2, Apr. 1966, pp. 125-131.
V. Guruswami, M. Sudan, "Improved Decoding of Reed-Solomon and Algebraic-Geometry Codes," *IEEE Trans. Infor. Theory*, vol. 45, No. 6, Sep. 1999, pp. 1757-1767.
R. Koetter and A. Vardy, "Algebraic Soft-Decision Decoding of Reed-Solomon Codes", *IEEE Trans. Infor. Theory*, vol. 49, No. 11, Nov. 2003, pp. 2809-2825.
M. Sudan, "Decoding of Reed Solomon codes beyond the error-correction bound," J. complexity, vol. 12, pp. 180-193, 1997.
E. Berlekamp, *Algebraic Coding Theory*, pp. 218-240, 1984.

\* cited by examiner

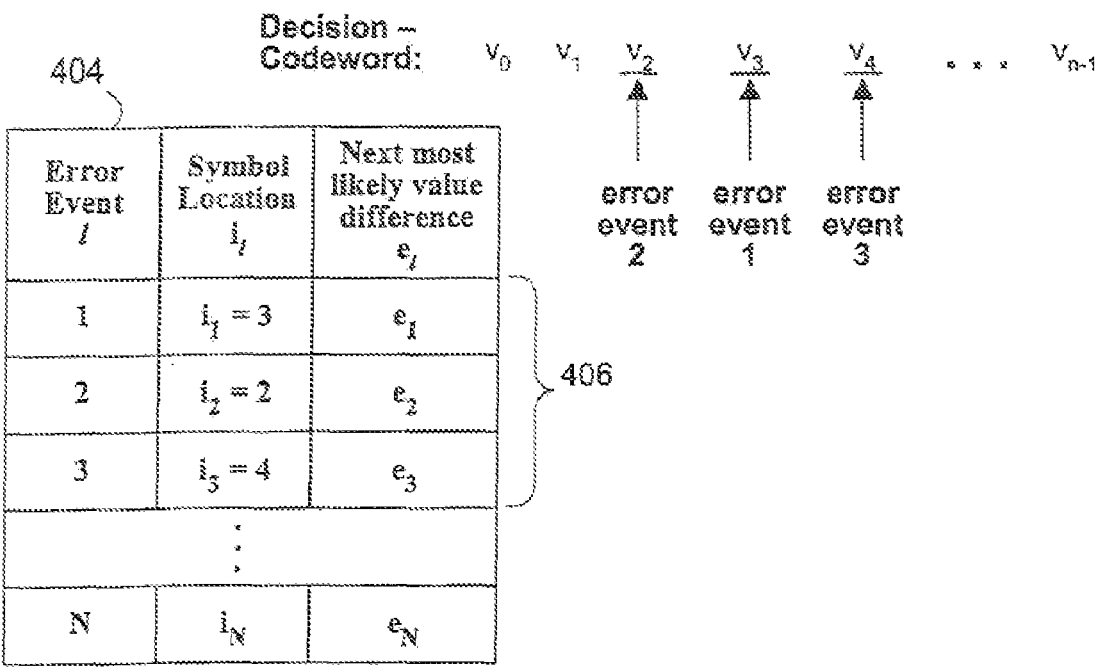
FIG. 4B
$$I = (\underset{\underset{\text{error event 1}}{\uparrow}}{1}, \underset{\underset{\text{error event 2}}{\uparrow}}{0}, \underset{\underset{\text{error event 3}}{\uparrow}}{1}, 0 \ldots \underset{\underset{\text{error event N}}{\uparrow}}{0})$$
FIG. 4C
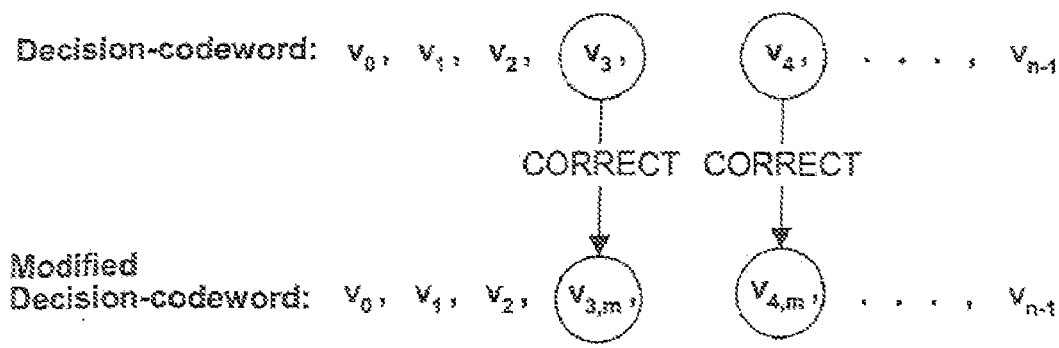
FIG. 4D

ITERATIVE REED-SOLOMON ERROR-CORRECTION DECODING

CROSS-REFERENCE TO RELATED APPLICATION

This application is a continuation of commonly-assigned U.S. patent application Ser. No. 11/006,381, filed Dec. 7, 2004, now U.S. Pat. No. 7,328,395, which claims the benefit of U.S. Provisional Patent Application No. 60/561,810, filed Apr. 13, 2004, both of which are hereby incorporated herein by reference in their entirety.

BACKGROUND OF THE INVENTION

This invention relates to systems and methods for correcting detector decision errors. In particular, systems and methods are disclosed for correcting decision errors if the errors are of a degree that exceeds the correction capability of an error-correction code.

In the area of information storage and communication, data generally exist in the form of electromagnetic signals. These signals are stored on signal bearing media and/or are carried on a communication channel where they are susceptible to being affected by interference signals, defects in the signal bearing media, or other phenomena. In relation to a signal containing data of interest, the interference signals and other phenomena can be generally characterized as "noise", and a signal of interest affected by noise can be referred to as a "noisy signal."

As used herein, a detector is a device that receives a noisy signal and attempts to decide, from the noisy signal, what the original data was. Because the noisy signal may be vastly different from the original (non-noisy) signal, errors can occur in a detector's decisions. Different types of detectors make the decisions with varying degrees of success. However, under certain conditions, even the most effective detectors can make incorrect decisions.

If a detector makes an incorrect decision, the time and resources required for another copy of the data to be re-generated or re-communicated can be nontrivial. One way to mitigate the commitment of such time and resources is to employ an error-correcting code (ECC) to identify and remove some or all of the decision errors made by a detector. One of the most effective ECCs is the well-known Reed-Solomon (RS) ECC. To apply the RS ECC, data of interest (called a dataword) are encoded by an RS encoder to provide encoded data (called a codeword), which is communicated as a signal. A detector receives a noisy signal corresponding to the codeword and decides, from the noisy signal, what the codeword was. An RS decoder then decodes the decisions to provide a resulting, decoded dataword. RS decoding works in a way that corrects none or all of the errors in a detector's decisions (not counting decoder error, i.e. mis-correction). Thus, if all of the errors in the decisions were corrected, the decoded dataword would be the same as the dataword provided to the RS encoder.

Information storage and communication is an area of ongoing research, and there is continued interest in improving the RS ECC. Of particular interest is a method known as soft-output decoding, in which a detector generates decisions and also generates reliability metrics that represent how confident it is about the decisions. U.S. patent application Ser. No. 09/904,507, which is commonly owned, describes soft-output decoding for controlled intersymbol interference channels. Also of particular interest is a method known as List ECC decoding, which is described in U.S. patent application Ser. Nos. 10/135,422 and 10/313,651. While soft-output decoding and list ECC decoding are effective, their implementation can be costly. Thus, there is continued interest in improving their technology and implementation.

SUMMARY OF THE INVENTION

In accordance with the disclosed invention, systems and methods are provided to correct errors in a decision-codeword generated by a detector by employing a Reed-Solomon error-correction code (RS ECC) having a particular correction capability to correct errors in the decision-codeword. If a decoder employing the RS ECC determines that errors in the decision-codeword are of a degree that exceeds the correction capability of the RS ECC, the decoder can iteratively modify the decision-codeword to reduce the number of errors therein.

During an iteration, if an RS decoder determines that errors in a decision-codeword are of a degree that exceeds the correction capability of the RS ECC, the RS decoder can modify the decision-codeword to produce one or more modified decision-codewords, which may each contain a lesser number of errors than the original decision-codeword. A modification can be a correction to a single symbol of the decision-codeword, such that only one symbol of a decision-codeword is altered in each modified decision-codeword in any particular iteration. A decoder can select a symbol to correct by referring to a list of most-likely error events. The value of a selected symbol can be corrected to a next-most-likely value.

During each iteration, an RS decoder generates one or more error indicators and uses them to perform error detection and correction operations. The error indicator(s) generated in a particular iteration can be generated using one or more error indicators from a previous iteration.

If an RS decoder determines that the errors in a decision-codeword can be completely corrected, the RS decoder can identify symbols in the decision-codeword that are erroneous and correct the values of such symbols.

Further features of the invention, its nature and various advantages, will be more apparent from the accompanying drawings and the following detailed description of various embodiments.

BRIEF DESCRIPTION OF THE DRAWINGS

FIG. 4B is a diagram of an exemplary list of most-likely error events and its relation to a decision-codeword;

FIG. 4C is a diagram of an incidence vector and its relation to error events;

FIG. 4D is a diagram of correcting decision-codeword symbols to produce a modified decision-codeword;

DETAILED DESCRIPTION

The disclosed technology is an invention for correcting errors that may occur when information that is stored or communicated is affected by noise or otherwise altered from its intended values.

Figure 1:
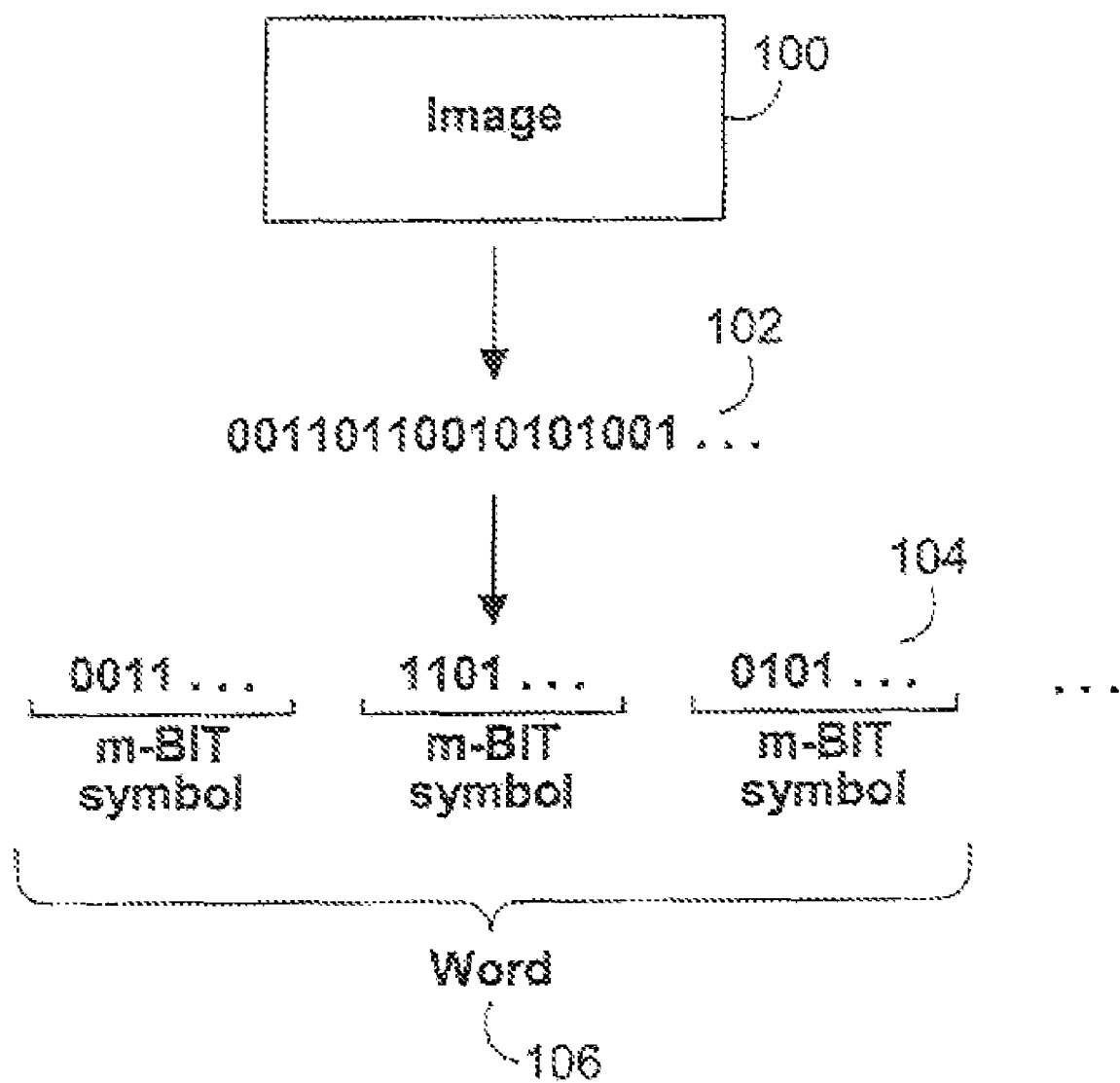
FIG. 1 is a diagram of information represented in the form of binary digits and symbols.

Information can come in various forms. Illustrated in FIG. 1 is an example of information in the form of a graphical image (100). The information in an image can relate to the image's size and colors, for example. Information is commonly represented as binary digits (zeros and ones) (102), which allow the information to be readily manipulated by electronic circuitry to perform useful operations. Some operations may manipulate a group of binary digits collectively. In the area of error correction, each group of binary digits can be referred to as a "symbol" (104). Thus, a symbol that includes a number m of binary digits can assume $2^m$ different values. Further, a particular grouping of symbols, such as three symbols, for example, can be referred to as a "word" (106).

Figure 2:
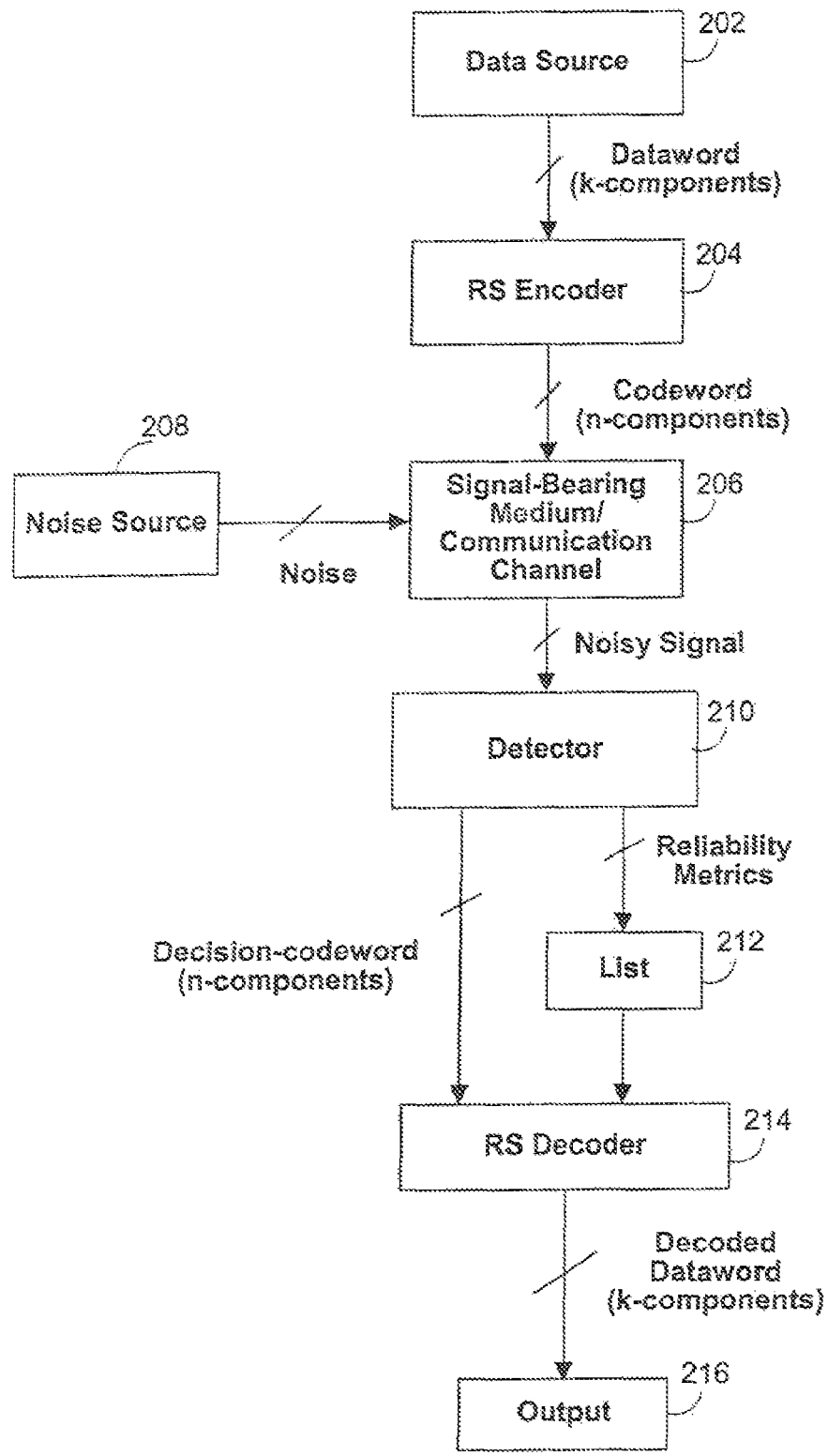
FIG. 2 is a diagram of an error-correction system that employs a Reed-Solomon error-correction code and includes a list of most-likely error events.

FIG. 2 is a block diagram of an exemplary error-correction system (200) that employs an error-correction code (ECC). In general, the functionality of an ECC is implemented in an encoder and a corresponding decoder. An ECC can be a block code, convolutional code, concatenated code, or another code, and can include turbo codes and low-density parity check codes, among others. In the particular embodiment of FIG. 2, the ECC is a Reed-Solomon ECC. A Reed-Solomon (RS) ECC encoder (204) performs encoding operations and an RS ECC decoder (214) performs decoding operations. The primary operation of an RS encoder is to generate a n-symbol word from a k-symbol word in a particular way (which will be described below), where n and k are integers and n>k. The k-symbol word is called a "dataword," and the n-symbol word is called a "codeword." The dataword can originate from a data source (202), which can be a text-based, audio-based, and/or image-based data source, for example.

A codeword can be stored as a signal on a signal-bearing medium and/or communicated on a communication channel (206) where it may be affected by noise. A "channel" as used herein can correspond to a particular path of media/devices through which a signal can flow, a particular wavelength or time slot which a signal can utilize, and/or another multiple access scheme. For example, the communication channel (206) can correspond to a read path of a disk drive, including a magnetic storage medium, disk-drive read head, and other devices. The noise can originate from a noise source (208) that is external to the signal-bearing medium/communication channel, or originate from within the signal-bearing medium/communication channel (not shown). A detector (210) attempts to determine, from a noisy signal, what the original codeword was. The result of the detector's determination will be referred to herein as a "decision-codeword," which will also have n symbols. A detector (210) can also generate reliability metrics (also called soft-information) that indicate a degree of confidence about the decision-codeword prior to RS ECC decoding. In one embodiment, the reliability metrics can be stored in a list (212) and can, for example, be organized in ascending or descending order according to reliability value. In certain circumstances, an RS decoder (214) may use the reliability metrics to aid in decoding the decision-codeword. The result of the decoding is a "decoded dataword," which is used by an output device (216).

The signal occurring on the signal-bearing medium (206) in FIG. 2 can be based on magnetic, electrical, optical, and/or acoustic technology, and the signal-bearing medium (206) can be, for example, copper wire, coaxial cable, optical fiber, a magnetic disk drive, an optical disk drive, air, water, or another medium, and can also be in gaseous, liquid, or solid form. The RS encoder (204), detector (210), list (212), and RS decoder (214) can contain one or more components, such as circuits or computer-executable instructions, that can be implemented in hardware, software, or some combination thereof. The techniques for such implementation are well-known. The detector (210) can employ a soft version of maximum-likelihood sequence detection, such as the soft-output Viterbi algorithm (SOVA), or another soft-output detection algorithm. The reliability metrics generated by the detector (210) can be bit log-likelihood ratios or symbol log-likelihood ratios, for example.

With continuing reference to FIG. 2, the additional (n−k) symbols in a codeword enable an RS decoder to perform its error-correction capability on a decision-codeword. There exist RS ECC decoding algorithms that can correct up to (n−k)/2 decision-codeword errors, such as the Berlekamp-Massey algorithm (BMA) which will be described herein. For convenience, the quantity (n−k)/2 will be denoted as t.

A brief review of RS ECC is provided as a preface to describing RS ECC decoding. The terminology used will be familiar to one skilled in the art. Reed-Solomon codes are defined over a Galois field GF(q), which means that every symbol of an RS ECC belongs to GF(q). An RS ECC over GF(q) includes n-symbol codewords $c=(c_0, c_1, c_2, \ldots, c_{n-1})$ and is denoted as RS (n, k). The value n is also referred to as the "length" of an RS ECC codeword. The maximum length of an RS ECC codeword is q−1. However, it is possible to construct RS codes over GF(q) having length less than q−1, and such codes are called "shortened codes". When an RS ECC is applied to information in the form of binary digits, it is generally the case that q will be equal to a power of two.

It is convenient to express a codeword $c=(c_0, c_1, c_2, \ldots, c_{n-1})$ using a polynomial notation $$c(x) = \sum_{i=0}^{n-1} c_i x^i.$$

Since every symbol in an n-symbol codeword belongs to a finite field GF(q), there are also a finite number of codewords in an RS ECC. Accordingly, if GF(q) [x] denotes the ring of polynomials over GF(q), then RS(n,k) can be defined as a finite subset of GF(q) [x]. Every Galois field GF(q) has a primitive element α∈GF(q) such that every non-zero element of GF(q) can be expressed as $\alpha^i$ for some i=0, . . . , q−2. In terms of this primitive element, RS(n,k) can be defined as:

RS(n,k)={c(x)∈GF(q)[x]|deg(c(x))<n,g(x)divides c(x)}, where $$g(x) = \prod_{i=0}^{n-k-1} (x - \alpha^{b+i})$$

is called a generator polynomial and is based on a fixed constant b. Different values of b in g(x) define different, but equivalent, RS ECC codes. Without loss of generality, it will be assumed from hereon that b=0. Since it is a condition that g(x) divides c(x), e.g., g(x) is a factor of c(x), the roots of g(x) are also roots of c(x). Thus, $$c(\alpha^0) = c(\alpha^1) = \ldots = c(\alpha^{n-k-1}) = 0.$$

For each polynomial $$v(x) = \sum_{i=0}^{n-1} v_i x^i$$

in GF(q) [x] of degree less than n, the Fourier transform over GF(q) is defined as $$V(x) = \sum_{i=0}^{q-2} V_i x^i,$$

where $V_i$ is called the i-th frequency component of v and is defined as $$V_i = v(\alpha^i) = \sum_{j=0}^{n-1} v_j \alpha^{ij}.$$

It can be shown that g(x) divides v(x) if and only if $V_0 = V_1 = \ldots = V_{n-k-1} = 0$. Thus, since g(x) divides c(x) in RS(n,k), RS(n,k) can be equivalently defined as $$RS(n,k) = \{c(x) \in GF(q)[x] | \deg(c(x)) < n, C_0 = C_1 = \ldots = C_{n-k-1} = 0\}$$

Such an RS ECC can allow an RS decoder (214) to correct up to t=(n−k)/2 errors in a decision-codeword.

Figure 3:
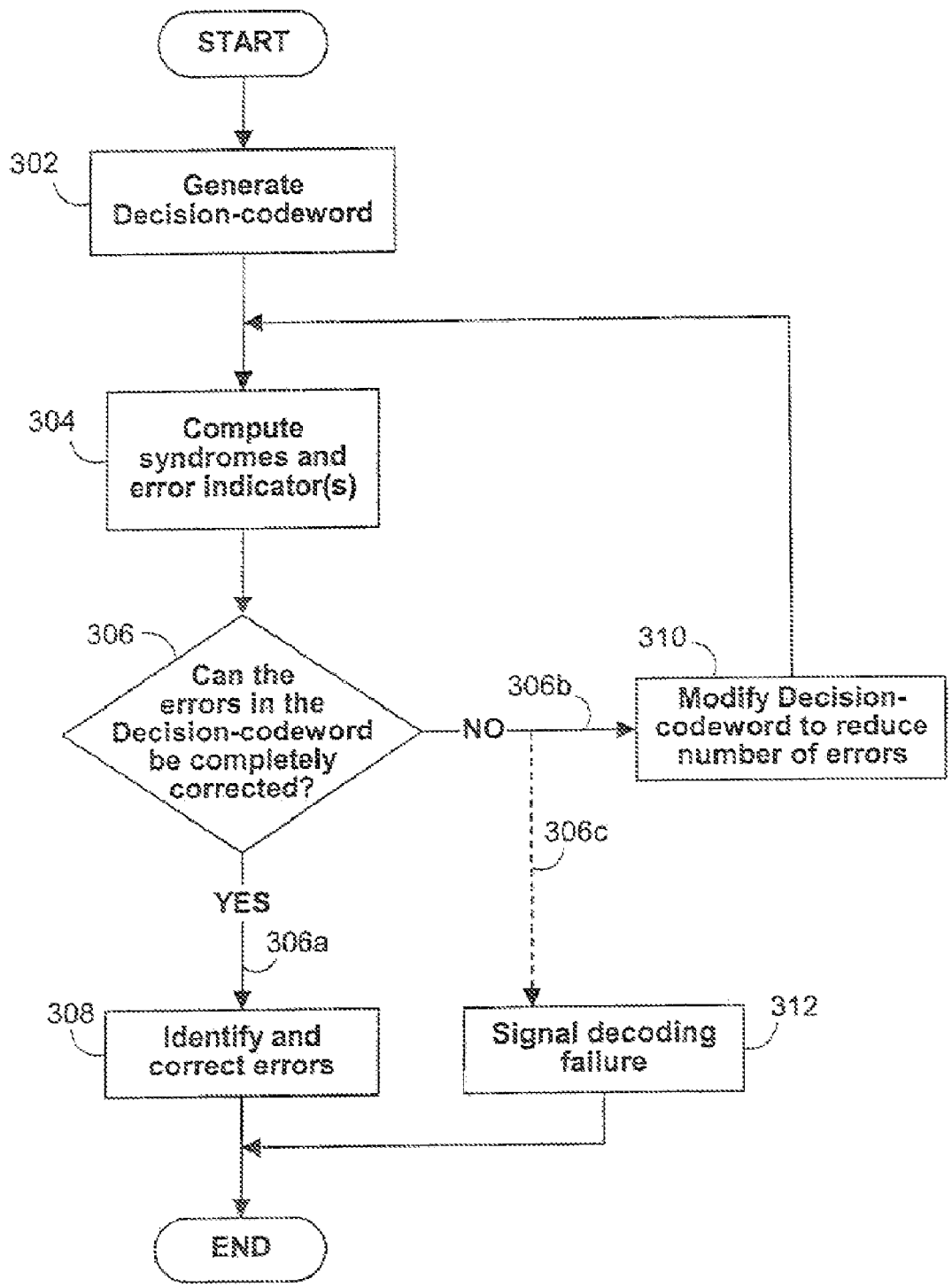
FIG. 3 is a flow diagram of iterative decoding operations performed by an RS decoder.

Referring now to FIG. 3, there is illustrated a flow chart (300) of exemplary RS decoding operations. The description below reviews syndrome calculation, the Berlekamp-Massey algorithm, Chien search, and the Forney algorithm.

In general, a detector generates a decision-codeword $v = (v_0, v_1, \ldots, v_{n-1})$ from a noisy signal (302). An RS decoder can use a decision-codeword to generate one or more error indicators that enable the decoder to perform error correction. A particular method of generating error indicators is known as the Berlekamp-Massey algorithm (BMA), in which the error indicators correspond to two polynomials, $\Lambda(x)$ and $B(x)$, called the error locator polynomial and scratch polynomial, respectively. As previously described herein, the Fourier transform of a decision-codeword v has q frequency components $V_0, V_1, \ldots, V_{q-1}$. The (n−k) frequency components $V_0, V_1, \ldots, V_{n-k-1}$ are a subset of the q frequency components and are called "syndromes." In general, syndromes are denoted as $S_i = V_i$, where $i=0$ to $(n-k-1)$.

The Berlekamp-Massey algorithm begins by computing the (n−k) syndromes of a decision-codeword v. Syndromes are used by the BMA to generate the error indicators $\Lambda(x)$ and $B(x)$ (304). The generating process is iterative, as follows:

1. Initialization: $\Lambda(x) \leftarrow 1$, $B(x) \leftarrow 1$, $r \leftarrow 0$, $L \leftarrow 0$
2. If r=(n−k), stop. Otherwise compute $$\Delta \leftarrow \sum_{i=0}^{L} (\Lambda_i S_{r-i})$$

3. Update $\Lambda(x)$ and $B(x)$ simultaneously as follows:

$\Lambda(x) \leftarrow \Lambda(x) - \Delta x B(x)$ if $\Delta \neq 0$ and $2L \leq r$,
then $B(x) \leftarrow \Delta^{-1} \Lambda(x)$ and $L \leftarrow r+1-L$
else $B(x) \leftarrow x B(x)$ 4. $r \leftarrow r+1$; go to step 2

When the iterations have completed, the polynomials $\Lambda(x)$ and $B(x)$ can be used to make several important determinations. An RS decoder can apply a method called the Chien search to the error locator polynomial to find the roots of $\Lambda(x)$. If the number of distinct roots coincides with the degree of $\Lambda(x)$, then BMA produced a "valid" error locator polynomial, meaning that all of the errors in the decision-codeword can be identified and corrected (306a). On the other hand, if the number of distinct roots is less than the degree of $\Lambda(x)$, then the errors in the decision-codeword cannot all be corrected (306b). Here and throughout we are omitting the possibility of decoder error or mis-correction.

The roots of the error locator polynomial that are identified by the Chien search are of the form $x = \alpha^{-i}$, such that $\Lambda(\alpha^{-i}) = 0$ The value of i in the equation signifies that the i-th symbol in the decision-codeword is in error. The magnitude of error in the i-th symbol can be computed using the Forney algorithm (or another equivalent procedure) to be:

$$e_i = \frac{\alpha^{-i(n-k-2)}}{B(\alpha^{-i}) \Lambda'(\alpha^{-i})}$$

where $\Lambda'$ is the derivative of the error locator polynomial. An RS decoder can correct an error in the i-th symbol of a decision-codeword by compensating the symbol with the quantity $-e_i$ to remove the error (308).

If the Chien search fails to find an adequate number of distinct roots in $\Lambda(x)$, then errors in the decision-codeword cannot be corrected using the error indicators (306b), signaling that the number of errors in the decision-codeword is greater than t, i.e., the number of errors exceeds the correction capability of the RS ECC.

In one embodiment, rather than re-generating or re-communicating the original codeword, an RS decoder can attempt to reduce the number of errors in a decision-codeword (310). One approach uses a list of most-likely error events and is described in application Ser. Nos. 10/313,651 and 10/135, 422. This approach will be briefly described.

The list of most-likely error events is based on reliability metrics. The reliability metrics are generated by a detector and indicate a degree of confidence about a decision-codeword. Each symbol of the decision-codeword $v = (v_0, v_i, \ldots, v_{n-1})$ can have at least one corresponding reliability metric. For example, a detector can generate q reliability metrics for each of the n symbols in a decision-codeword by computing the set of values $\{(r_{j,i}), j=0, \ldots, q-1, i=0, \ldots, n-1\}$, where $r_{j,i}$ is a probability that $v_i$ is equals to j, where j belongs to GF(q). It is convenient to represent this set of soft information in the q by n matrix $\Pi$, where $\Pi(j,i)=r_{j,i}$. Alternatively, probability-based reliability information $\Pi$ can be replaced by log-likelihood-based reliability information $\Pi^*$, where $$\Pi^*(j, i) = \frac{\text{LOG}(\max_k(\Pi(k, i)))}{\text{LOG}(\Pi(j, i))} = \frac{\text{LOG}(\Pi(v_i, i))}{\text{LOG}(\Pi(j, i))}.$$

Notice that $\Pi^*(v_i,i)=1$, $\forall i=0, \ldots, n-1$, and $\Pi^*(j,i) \leq 1$, $\forall i=0, \ldots, n-1, j=0, \ldots, q-1$.

Computing $\Pi$ or $\Pi^*$ can be computationally intensive, and it can be more practical to utilize an incomplete/suboptimal set of reliability information L, where L={$(i_1,j_1)$, $(i_2, j_2), \ldots, (i_N, j_N)$} is a collection of N indices corresponding to the N largest elements of $\Pi^*$ not including a set {$\Pi^*(v_i,i)|i=0, \ldots, n-1$}. Thus defined, L is a list of the N most-likely symbol errors, which are referred to as "error events". Accordingly, L is referred to herein as a list of most-likely error events. The N error events in list L can also be represented in polynomial notation as L{=$j_1x^{i_1}, j_2x^{i_2}, \ldots, j_Nx^{i_N}$} where each most-likely error event is represented as polynomial $jx^i$ in GF(q) [x], where the exponent i identifies the location of the error event as the i-th symbol in a decision-codeword and the coefficient j gives the next-most-likely value for that i-th symbol. Equivalently, the list of most-likely error events L can be represented as L={$e_1x^{i_2}, e_2x^{i_2}, \ldots, e_Nx^{i_N}$}, where for each error event $ex^i$, e is defined as $e=v_i-j$, which is the difference between the value of the i-th symbol $v_i$ and the next-most-likely value j for that symbol. Note that if v(x) represents a decision-codeword, then $v(x)-e_lx^{i_l}$ represents an alternative decision-codeword obtained by "correcting" the l-th error event in the list L. Specifically, this correction is accomplished by subtracting the value $e_l$ from the $i_l$-th symbol in the original decision-codeword. If the symbol that is corrected in a decision-codeword was an error, and the corresponding symbol in the alternative decision-codeword corrects that error, then the alternative decision-codeword would contain a lesser number of errors than the original decision-codeword. Accordingly, it is possible for an alternative decision-codeword to contain a number of errors that is less than or equal to the correction capability of the RS decoder. Thus, an RS decoder according to the above-described technology can reduce the number of errors in a decision-codeword without re-generating or re-communicating the original codeword.

Figure 4A:
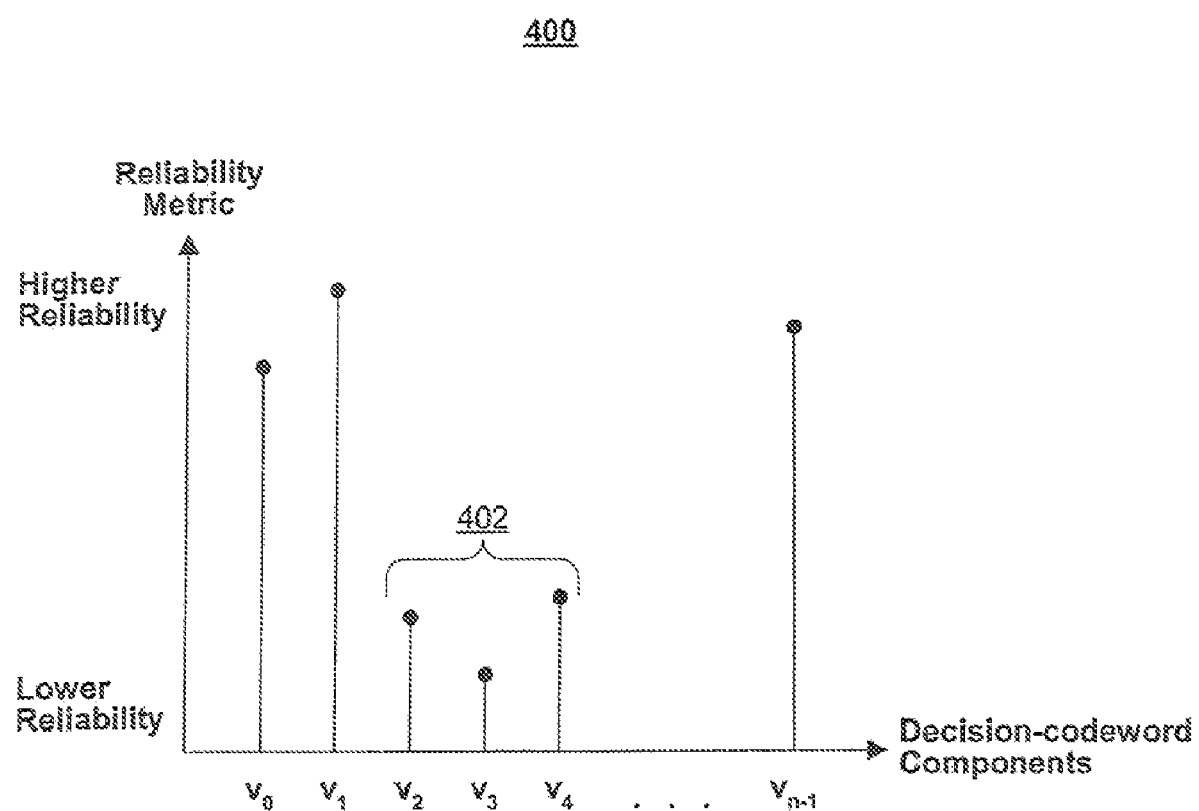
FIG. 4A is a graph of exemplary values of reliability metrics for a decision-codeword.

FIG. 4A is a graph (400) of exemplary values of reliability metrics for a decision-codeword. As shown, there is one reliability value for each symbol. A higher reliability metric value can indicate a greater confidence in the value of the corresponding decision-codeword symbol, and a lower reliability metric value can indicate a lower confidence. In the exemplary graph (400) of FIG. 4A, the lowest reliability metric values (402) correspond to decision-codeword symbols $v_2$, $v_3$, and $v_4$. Thus, it is more likely that symbols $v_2$, $v_3$, and/or $v_4$ do not have correct values.

FIG. 4B shows an exemplary list (404) that contains N most-likely error events. In one embodiment, the error events are ordered according to the reliability value. Thus, the first three error events (406) in the list correspond to the symbols in FIG. 4A that have the lowest reliability values (402). Each error event in the list corresponds to a symbol in the decision-codeword. As shown in the figure, error event one corresponds to symbol three in the decision-codeword, and error event two corresponds to symbol two. In general, the symbol corresponding to an error event l is identified by the value $i_l$ in the list. Additionally, a list can contain a difference value $e_l$, which can be used to compute the next-most-likely value for symbol $i_l$.

The error events in the list may occur in a decision-codeword individually or as a group of two errors, three errors, and so on up to a group of N errors. The total number of combinations of error events, w, is computed by $$w = \sum_{i=0}^{N} \binom{N}{i} = \sum_{i=0}^{N} \frac{(N!)}{(i!)(N-i)!}.$$

Referring to FIG. 4C, a combination of error events can be represented by a vector I called the incidence vector, which identifies the error event(s) from the list L that are in the combination. The incidence vector has N bits that correspond to the N error events in the list L. The value of a bit l in the incidence vector is one if error event l is in the combination, and is a zero otherwise. For example, consider a particular combination that contains error events one and three. Accordingly, as shown in the incidence vector of FIG. 4C, bit one and bit three are one and the other bits are zero. Referring also FIG. 4D, an RS decoder "corrects" error events that correspond to a "one" in the incidence vector. Error event one corresponds to symbol $v_3$, and error event three corresponds to symbol $v_4$. Thus, symbols $v_3$ and $v_4$ in the decision-codeword are corrected to contain their next-most-likely values, which are denoted as $v_{3,m}$ and $v_{4,m}$. Using the difference value $e_1$ corresponding to error event one, $v_{3,m}$ is computed to be $(v_3-e_1)$. Similarly, using the difference value $e_3$ corresponding to error event three, $v_{4,m}$ is computed to be $(v_4-e_3)$. The decision-codeword containing the corrected symbols $v_{3,m}$ and $v_{4,m}$ is referred to herein as a "modified decision-codeword."

Referring again to FIG. 3, for a modified decision-codeword (310), an RS decoder can use BMA to generate an error locator polynomial $\Lambda(x)$ (304), apply the Chien search to find the roots of $\Lambda(x)$, and compare the number of distinct roots to the degree of $\Lambda(x)$ to determine if errors in the modified decision-codeword can be completely corrected (306), i.e., if the $\Lambda(x)$ is valid. If $\Lambda(x)$ is valid (306a), then the number of errors in the corresponding modified decision-codeword is less than or equal to t, and all of the errors can be identified and corrected using the Forney algorithm or an equivalent (308). On the other hand, if $\Lambda(x)$ is not valid for the modified decision-codeword (306c), an RS decoder can generate a signal indicating that a decoding failure has occurred (312).

Figure 5:
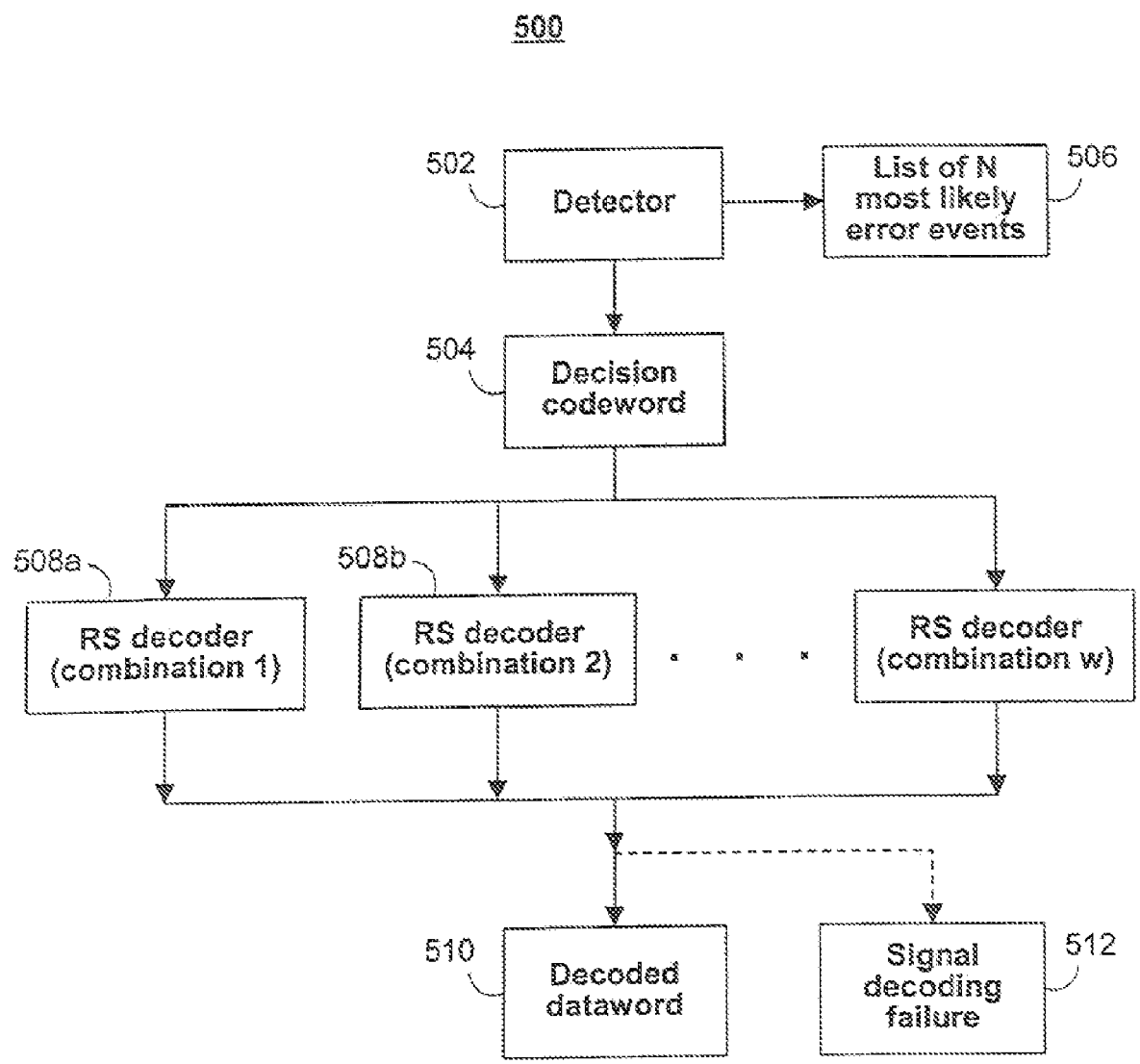
FIG. 5 is a block diagram of an exemplary list RS decoder.

Referring now to FIG. 5, there is shown a block diagram of a list RS decoder (500) that contains several RS decoders (508) that operate in accordance with the flow diagram of FIG. 3. A detector (502) generates a decision-codeword (504) and a list of most-likely error events (506). Then, an RS decoder computes syndromes and error indicator(s) for the decision-codeword using BMA. In the illustrated embodiment, there is an RS decoder for each distinct combination of error events. Since there are w such combinations, the illustrated list RS decoder contains w RS decoders. The RS decoder that finds the error indicator(s) for the decision-codeword (504) can be one of the several RS decoders, such as the first RS decoder (508a), for example. If the RS decoder (508a) determines that errors in the decision-codeword (504) cannot be completely corrected, the remaining w−1 RS decoders then become activated. Each RS decoder is associated with a particular combination of error events and corrects the decision-codeword (504) according to its associated combination to generate a modified decision-codeword. If a modified decision-codeword from one of the RS decoders (508) can be correctly decoded, the RS decoder having that modified decision-codeword performs the decoding to generate a decoded dataword (510). In the case that none of the RS decoders (508) has a modified decision-codeword that can be correctly decoded, the list RS decoder (500) generates a signal (512) indicating that a decoding failure has occurred.

It is contemplated that a list RS decoder can be implemented in a manner different from that shown in FIG. 5. As an example, a list RS decoder can contain 1+(w−1)/2 parallel-connected RS decoders, where each RS decoder, except for 508(a), is associated with two combinations of error events. If the first error event combination does not produce a modified decision-codeword that can be correctly decoded, an RS decoder then tries the second error event combination.

Referring again to the RS decoder operation shown in FIG. 3, various aspects of the operation can be enhanced to improve the overall operation of an RS decoder. For example, the Berlekamp-Massey algorithm used to find error indicator(s) is considered to be an optimal algorithm. Although it offers better performance compared to sub-optimal algorithms, its computation time and hardware complexity is also relatively more expensive. Thus, sub-optimal algorithms may be more appropriate for certain applications.

Figure 6:
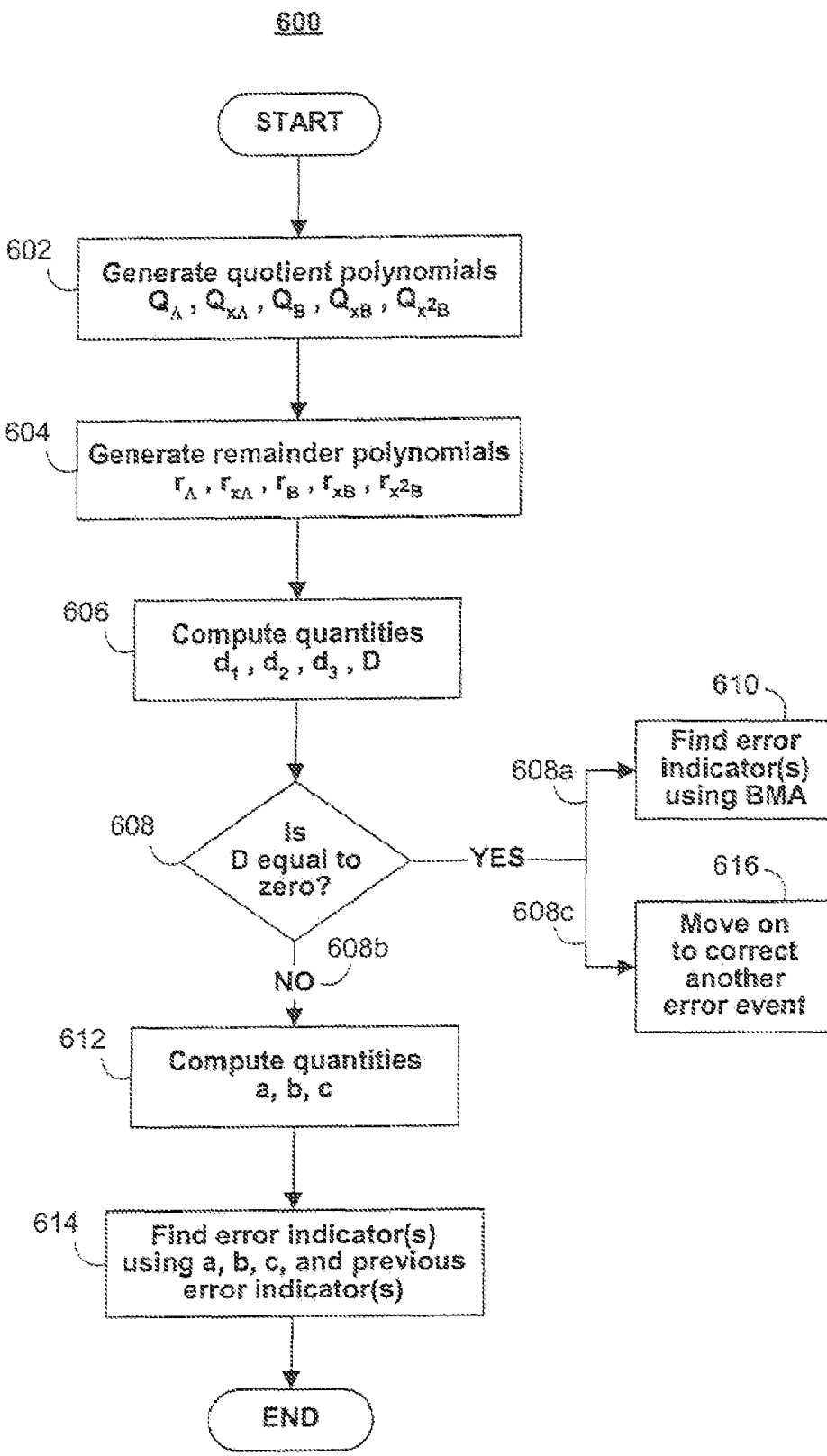
FIG. 6 is a flow diagram of operations performed by an RS decoder for generating error indicators.

FIG. 6 shows one aspect of the present invention in which an RS decoder generates error indicators for a modified decision-codeword by direct calculation rather than by using the BMA. As described below, an RS decoder can generate error indicators iteratively by using error indicators from prior iterations. To distinguish between different syndromes and error indicators from different iterations, the syndromes and error indicators for an original decision-codeword will be denoted as $S_i$'s, $\Lambda(x)$, and $B(x)$, and the syndromes and error indicators for a modified decision-codeword will be denoted as $S_i^{(e_1, e_2, \cdots)}$, $\Lambda^{(e_1, e_2, \cdots)}(x)$, and $B^{(e_1, e_2, \cdots)}(x)$, where $e_l$ in the superscript indicates that error event l has been corrected. The notation thus refers to the list of most-likely error events shown in FIG. 4B.

The starting point in the development of the iterative calculation is the pair of polynomials $(\Lambda(x), B(x))$ from the second step of the BMA algorithm for the received vector v, along with the 2t syndromes, $S_i$, i=0, . . . , 2t−1. We begin by treating a special case where the number of symbol errors is equal to t+1, and the list of most likely error events consists of a single true error event $L=\{e x^j\}$. The goal is to obtain $(\Lambda^{(e)}(x), B^{(e)}(x))$ corresponding to the modified received codeword $v+e x^j$ as a function of $(\Lambda(x), B(x))$, therefore avoiding the necessity of having an extra BMA unit.

If two more error syndromes $S_{2t}$, $S_{2t+1}$ were available, then the Berlekamp-Massey algorithm would converge to $(\Lambda^{(e)}(x), B^{(e)}(x))$ in two more iterations. In reality, $S_{2t}$, $S_{2t+1}$ are not given. However, it is possible to proceed by treating $S_{2t}$, $S_{2t+1}$ as unknown variables. Running the BMA algorithm for two more iterations gives rise to the following evolution of error indicators:

Case 1: $\deg(\Lambda(x))$ is equal to t $$\Lambda^{(e_1)}(x)=\Lambda(x)+ax\Lambda(x)+bxB(x) \quad (EQ1)$$

$$B^{(e_1)}(x)=\Lambda(x)+cB(x) \quad (EQ2)$$

Case 2: $\deg(\Lambda(x))$ is not equal to t $$\Lambda^{(e_1)}(x)=\Lambda(x)+axB(x)+bx^2B(x) \quad (EQ3)$$

$$B^{(e_1)}(x)=xB(x)+cB(x) \quad (EQ4)$$

where a, b, c are unknown scalars which depend on $S_{2t}$, $S_{2t+1}$.

Since it was assumed that $e x^j$ is a true error event, $\Lambda^{(e_1)}(x)$ must satisfy the following two conditions:

$$Rem(\Lambda^{(e_1)}(x), \alpha^j x + 1) = 0 \quad (EQ5)$$

$$\sum_{i=0}^{t} S_{t+j-i}^{e_1} Q_i = 0, \; j=0, \ldots, t-1$$

where $$Q(x) = \frac{\Lambda^{(e_1)}(x)}{x\alpha^j + 1},$$

and $S_i^{e_1}$, i=0, . . . , 2t−1 denote the set of modified syndromes obtained by correcting $e_1$. The second condition in EQ5 gives rise to a family of dependent constraints. As a result, it is enough to look at a single one of them, e.g., j=t−1.

EQ5 can be used to solve for a and b. Without loss of generality consider Case 1. Case 2 can be handled in a similar manner. Let $Q_\Lambda$, $Q_{x\Lambda}$, $Q_B$, $Q_{xB}$, $Q_{x^2B}$, and $r_\Lambda$, $r_{x\Lambda}$, $r_B$, $r_{xB}$, $r_{x^2B}$ be the quotients and remainders resulting from division of $\Lambda(x)$, $x\Lambda(x)$, $B(x)$, $xB(x)$, and $x^2B(x)$ by $x\alpha^j+1$. Also let $$\sum_{i=0}^{t} [S_{2t-i}^{e_1}(Q_\Lambda)_i] = d_1 \quad (EQ6)$$

$$\sum_{i=0}^{t} [S_{2t-i}^{e_1}(Q_{x\Lambda})_i] = d_2$$

$$\sum_{i=0}^{t} [S_{2t-i}^{e_1}(Q_{xB})_i] = d_3.$$

Then the two independent conditions of EQ5 can be written as a system of two linear equations $$\begin{bmatrix} r_{x\Lambda} & r_{xB} \\ d_2 & d_3 \end{bmatrix} \begin{bmatrix} a \\ b \end{bmatrix} = \begin{bmatrix} r_\Lambda \\ d_1 \end{bmatrix}. \quad (EQ7)$$

If the system in EQ7 can be solved for a and b, then this should uniquely determine the error locator polynomial. Let $$D = \text{determinan}\left(\begin{bmatrix} r_{x\Lambda} & r_{xB} \\ d_2 & d_3 \end{bmatrix}\right). \quad (EQ8)$$

If D is not equal to 0, the solution exists and is given by $$a = (r_\Lambda d_3 + r_{xB} d_1) D^{-1} \quad (EQ9)$$

$$b = \begin{cases} (d_1 + a d_2) d_3^{-1} & \text{if } d_3 \neq 0 \\ (r_\Lambda + a r_{x\Lambda}) r_{xB}^{-1} & \text{otherwise} \end{cases}.$$

Finally it remains to compute $B^{(e_1)}(x)$. This computation is not needed for the special case of t+1 erroneous symbols. However it is going to be necessary for the general case. To solve for $B^{(e_1)}(x)$ from EQ2 it is necessary to specify the value of scalar c, which is chosen so that EQ10 holds true.

$$Rem(B^{(e_1)}(x), \alpha^j x+1) = r_\Lambda + c r_B = 0 \tag{EQ10}$$

or $$c = r_\Lambda r_B^{-1}. \tag{EQ11}$$

The constraint in EQ10 is necessitated by the requirement:

$$\sum_{i=0}^{t} S_{t+j-i}^{e_1} B_i^{e_1} = 0, j = 0, \ldots, t-1. \tag{EQ12}$$

Regardless of the choice of coefficient c, $B^{(e_1)}(x)$ defined by EQ2 satisfies $$\sum_{i=0}^{t} S_{t+j-i} B_i^{e_1} = 0, j = 0, \ldots, t-1.$$

Writing $S_i = S_i^{(e_1)} + (S_i - S_i^{(e_1)})$ yields $$0 = \sum_{i=0}^{t} S_{t+j-i} B_i^{e_1} = \sum_{i=0}^{t} S_{t+j-i}^{e_1} B_i^{e_1} + \sum_{i=0}^{t} (S_{t+j-i} - S_{t+j-i}^{e_1}) B_i^{e_1},$$

$$j = 0, \ldots, t-1,$$

where the last term is 0 provided EQ10 holds.

In summary, starting with $(\Lambda(x), B(x), S)$ we obtain a new triplet $$\left( \hat{\Lambda}^{(e_1)} = \frac{\Lambda^{(e_1)}(x)}{\alpha^{j_1} x + 1}, B^{(e_1)}(x), S^{(e_1)} \right),$$

without having to run BMA.

Three aspects of implementation are discussed next. These are (1) carrying out long division, (2) computing modified syndromes, and (3) carrying out error correction.

To compute $Q_\Lambda$, $Q_{x\Lambda}$, $Q_B$, $Q_{xB}$, $Q_{x^2B}$, and $r_\Lambda$, $r_{x\Lambda}$, $r_B$, $r_{xB}$, $r_{x^2B}$, it is not necessary to carry out five long divisions. In fact, only two are needed. Suppose the polynomial division of has been carried out, i.e., $$\Lambda(x) = Q_\Lambda(x + \alpha^{-j}) + r_\Lambda$$

$$B(x) = Q_B(x + \alpha^{-j}) + r_B \tag{EQ13}$$

and consider the problem finding the remaining three decompositions for $x\Lambda(x)$, $xB(x)$ and $x^2B(x)$. The following derivation will concentrate on $x\Lambda(x)$. The other two can be handled in a similar manner.

$$r_{x\Lambda} = Rem(Rem(x, x + \alpha^{-j}) \cdot r_\Lambda, x + \alpha^{-j}) = r_\Lambda \alpha^{-j} \tag{EQ14}$$

$$Q_{x\Lambda} = x Q_\Lambda + r_\Lambda. \tag{EQ15}$$

To verify EQ15, simply observe that $$Q_{x\Lambda}(x + \alpha^{-j}) + r_{x\Lambda} = (x Q_\Lambda(x + \alpha^{-j}) + r_\Lambda x + r_\Lambda \alpha^{-j}) + r_\Lambda \alpha^{-j} \tag{EQ16}$$

$$= x(\Lambda(x) + r_\Lambda) + r_\Lambda x$$

$$= x \Lambda(x).$$

Turning now to computing modified syndromes of EQ5, it is not necessary to use the syndrome compute block of the BMA algorithm. Instead a simplified algorithm can be readily devised. Let $S_i$, $i = 0, \ldots, 2t-1$ corresponding to Viterbi output v be given and $ex^j$ be the error event from the list. We wish to compute the syndromes $S_i^j$, $i = 0, \ldots, 2t-1$ corresponding to the received codeword $v + ex^j$. By linearity, it readily follows that $S_i^e = S_i + e \alpha^{ji}$.

Finally, to carry out the error correction procedure it is important to observe that all the information pertaining to e has been factored out in error locator polynomial $\hat{\Lambda}^{(e)}$ and modified syndromes $S^{(e)}$. As a result, running the Forney algorithm on $$\left( \hat{\Lambda}^{(e_1)} = \frac{\Lambda^{(e_1)}(x)}{\alpha^{j_1} x + 1}, B^{(e_1)}(x), S^{(e_1)} \right)$$

would not result in correction of e. The error events from the list have to be corrected manually.

The flow chart 600 of FIG. 6 summarizes computing $\Lambda^{(e_1)}(x)$ for a modified decision-codeword using $\Lambda(x)$ for the original decision-codeword as provided above herein. The error event $e_1$ is selected according to an incidence vector. For example, suppose that the incidence vector is that of FIG. 4C. Bit number one is the first "one" in the incidence vector, so an RS decoder corrects error event one, i.e., symbol three in the decision-codeword. An RS decoder can compute $\Lambda^{(e_1)}(x)$ by first generating the quotient polynomials $Q_\Lambda$, $Q_{x\Lambda}$, $Q_B$, $Q_{xB}$, $Q_{x^2B}$ (602) and remainder polynomials $r_\Lambda$, $r_{x\Lambda}$, $r_B$, $r_{xB}$, $r_{x^2B}$ (604), which are the quotients and remainders resulting from division of $\Lambda(x)$, $x\Lambda(x)$, $B(x)$, $xB(x)$, and $x^2B(x)$ by $x\alpha^{i_l}+1$. The values of l and $i_l$ correspond to the error event that was corrected. Since error event one was corrected, $l=1$ and $i_l=i_1=3$. Thus, $x\alpha^{i_l}+1$ is $x\alpha^3+1$ for error event one. As noted earlier, the quotients and remainders of dividing $x\Lambda(x)$, $xB(x)$, $x^2B(x)$ by $x\alpha^{i_l}+1$ can be computed using $Q_\Lambda$, $Q_B$, $r_\Lambda$, and $r_B$. For example, $r_{x\Lambda} = r_\Lambda \alpha^{-j}$ and $Q_{x\Lambda} = x Q_\Lambda + r_\Lambda$. The other quotient and remainder polynomials can be computed in a similar manner. Then, using the syndromes $S_j^{(e_1)}$, $j = 0 \ldots (n-k-1)$, for the modified decision-codeword, an RS decoder can use the quotient and remainder polynomial coefficients to compute the quantities (606):

$$d_1 = \sum_{i=0}^{t} \left[ S_{n-k-i}^{(e_1)} (Q_\Lambda)_i \right],$$

$$d_2 = \sum_{i=0}^{t} \left[ S_{n-k-i}^{(e_1)} (Q_{x\Lambda})_i \right],$$

$$d_3 = \sum_{i=0}^{t} \left[ S_{n-k-i}^{(e_1)} (Q_{xB})_i \right], \text{ and}$$

-continued $$D = \text{determinant}\begin{bmatrix} r_{x\Lambda} & r_{xB} \\ d_2 & d_3 \end{bmatrix}.$$

If the value of D is equal to zero (608*a*), then the RS decoder must use the BMA to generate $\Lambda^{(e_1)}(x)$ and $B^{(e_1)}(x)$ (610). Optionally, rather than computing the error indicators by BMA, an RS decoder can abandon calculating the error indicators (608*c*) and move on to correct another error event (616). On the other hand, if the value of D is not equal to zero (608*b*), the RS decoder can compute $\Lambda^{(e_1)}(x)$ and $B^{(e_1)}(x)$ (612-614) by:

$$\Lambda^{(e_1)}(x) = \begin{cases} \Lambda(x) + ax\Lambda(x) + bxB(x) & \text{if } \deg[\Lambda(x)] = t \\ \Lambda(x) + axB(x) + bx^2B(x) & \text{if } \deg[\Lambda(x)] \neq t \end{cases}$$

$$B^{(e_1)}(x) = \begin{cases} \Lambda(x) + cB(x) & \text{if } \deg[\Lambda(x)] = t \\ xB(x) + cB(x) & \text{if } \deg[\Lambda(x)] \neq t \end{cases}$$

where $$a = (r_\Lambda d_3 + r_{xB} d_1)D^{-1}$$

$$b = \begin{cases} (d_1 + ad_2)d_3^{-1} & \text{if } d_3 \neq 0 \\ (r_\Lambda + ar_{x\Lambda})r_{xB}^{-1} & \text{otherwise} \end{cases}$$

$$c = r_\Lambda r_B^{-1}.$$

Using the error locator polynomial $\Lambda^{(e_1)}(x)$, an RS decoder can apply the Chien search to find the roots of $\Lambda^{(e_1)}(x)$, and compare the number of distinct roots to the degree of $\Lambda^{(e_1)}(x)$ to determine if errors in the modified decision-codeword can be completely corrected. If so, the errors can be corrected using the Forney algorithm or an equivalent. If the errors in the decision-codeword cannot be completely corrected, it is possible that the number of errors still exceeds t=(n−k)/2. When this occurs, an RS decoder can refer to the incidence vector to correct another error event. As shown in the incidence vector of FIG. 4C, the next bit that is "one" corresponds to error event three. The RS decoder can correct error event three and can compute $\Lambda^{(e_1,e_3)}(x)$ and $B^{(e_1,e_3)}(x)$ using $$\hat{\Lambda}^{(e_1)} = \frac{\Lambda^{(e_1)}(x)}{\alpha^{j_1}x + 1}$$

and $B^{(e_1)}(x)$ by iterating the operations shown in the flow chart (600) of FIG. 6. Thus, for the general case where there are more than t+1 symbol errors, we can start with a triplet, e.g., from a first iteration $(\hat{\Lambda}^{(e_1)}, B^{(e_1)}(x), S^{(e_1)})$, and compute other triplets, e.g., $$\left(\hat{\Lambda}^{(e_1,e_3)} = \frac{\Lambda^{(e_1,e_3)}(x)}{\alpha^{j_3}x + 1}, B^{(e_1,e_3)}(x), S^{(e_1,e_3)}\right),$$

in a further iteration using $\hat{\Lambda}^{(e_1)}$, $B^{(e_1)}(x)$, and $S^{(e_1)}$. In this manner, the RS decoder corrects one additional error event per iteration until the number of errors in a decision-codeword decreases to t or until there are no more error events in the list to correct.

In one embodiment, if there are no more error events in the list to correct and the number of errors is still greater than t, an RS decoder can restart the iterative process for another combination of error events. An RS decoder need not restart the iterative process from the original decision-codeword if the new combination has the same beginning sequence of error events. Accordingly, previously computed error indicators from several or all previous iterations can be stored in a memory to avoid redundantly computing the same error indicators.

In one embodiment, a list RS decoder can contain several RS decoders that operate iteratively in accordance with the flow diagram of FIG. 6. Each of the RS decoders corrects one error event per iteration and computes error indicators for an iteration by using error indicators from a prior iteration. The RS decoders can be collectively configured to correct error events in one-error combinations before correcting error events in two-error combinations, and so on.

Referring again to the RS decoder operations shown in FIG. 3, another aspect of RS decoder operation that can be enhanced is that of deciding whether errors in a decision-codeword can be completely corrected (306). The determination generally can only be made following Chien search, by comparing the number of distinct roots of the error locator polynomial with the degree of the error locator polynomial. Therefore, it is necessary to run the Chien search for each of the w candidate error locator polynomials produced by the algorithm in FIG. 3 to determine its validity.

The Chien search can be time and hardware-consuming and can be often avoided by prescreening candidate error locator polynomials prior to forwarding them to the Chien search block. This is accomplished by using an enhanced RS ECC, $RS^{enh}(n+1,k)$, that corresponds to an enhanced generator polynomial $$g^{enh}(x) = \prod_{i=0}^{n-k} (x - \alpha^i).$$

The enhanced generator polynomial has an extra factor $(x-\alpha^{n-k})$ compared to the non-enhanced g(x) and has degree (n−k+1). Since $g^{enh}(x)$ divides c(x), it follows that $$c(\alpha^0) = \ldots = c(\alpha^{n-k-1}) = c(\alpha^{n-k}) = 0.$$

The enhanced RS ECC is then defined by $$RS^{enh}(n+1,k) = \{c(x) \in GF(q)[x] | \deg(c(x)) < n+1, C_0 = C_1 = \ldots = C_{n-k} = 0\}.$$

Correspondingly, a decision-codeword will have one extra syndrome.

Since the extra syndrome is not utilized by BMA, it can be used to quickly identify invalid candidate error locator polynomials. Specifically, an RS decoder can make the determination by evaluating the condition $$\sum_{i=0}^{t}(S_{n-k-i}\Lambda_i) = 0, \qquad \text{(EQ17)}$$

where $\Lambda_i$ are the coefficients of an error locator polynomial $\Lambda(x)$. If the equality in EQ17 is false, then $\Lambda(x)$ is an invalid error locator polynomial, and it is not necessary to follow up with a Chien search. If the equality is true (306a), then $\Lambda(x)$ might be valid, and a Chien search procedure can be used to check if $\Lambda(x)$ leads to a valid RS ECC codeword.

This allows reduction of the number of Chien search units from w (one for each candidate error locator polynomial) to as little as one. For example, it is possible to select at most two valid candidate error locator polynomials based on EQ17. Only the candidates which were pre-qualified by test in EQ17 are then passed to the Chien search unit. Of course, the reduction in hardware complexity achieved through the use of EQ17 does not come for free. First, the addition of an extra symbol of redundancy has a negative effect on channel bit density. Secondly, limiting the number of Chien search units to two might cause some performance degradation. For example, if there are three candidate error locator polynomials which pass the test of EQ17, the first two are false positives and the last one is the one we are looking for, then the sub-optimal list RS ECC decoder would fail to recover the transmitted codeword, whereas the detector on FIG. 3 would succeed.

The reliability of the pre-screening procedure can be improved by increasing the number of additional syndromes. An enhanced RS ECC that has additional syndromes can be generally defined by:

$$RS^{enh}(n+\Delta, k) = \{c(x) \in GF(q)[x] | \deg(c(x)) < n+\Delta, C_0 = C_1 = \ldots = C_{n-k-1+\Delta} = 0\},$$

where $\Delta \geq 1$. A corresponding decision-codeword will have $\Delta$ additional syndromes. The pre-screening test condition of EQ17 can be generalized to use these additional syndromes by:

$$\sum_{j=0}^{t} (S_{2t+i-1-j} \Lambda_j) = 0, \quad i = 1, \ldots, \Delta. \quad (EQ18)$$

As the reliability of the pre-screening procedure improves, candidate error locator polynomials that pass the pre-screening will include less false positives. Thus, given a high enough reliability, it may be effective to select only one candidate error locator polynomials for the Chien search. However, in general, any number of candidate error locator polynomials between one and w can be selected. As previously mentioned herein, having a greater number of candidate error locator polynomials improves the chances of obtaining a valid error locator polynomial. However, this improvement comes at the cost of greater hardware and implementation complexity.

Figure 7:
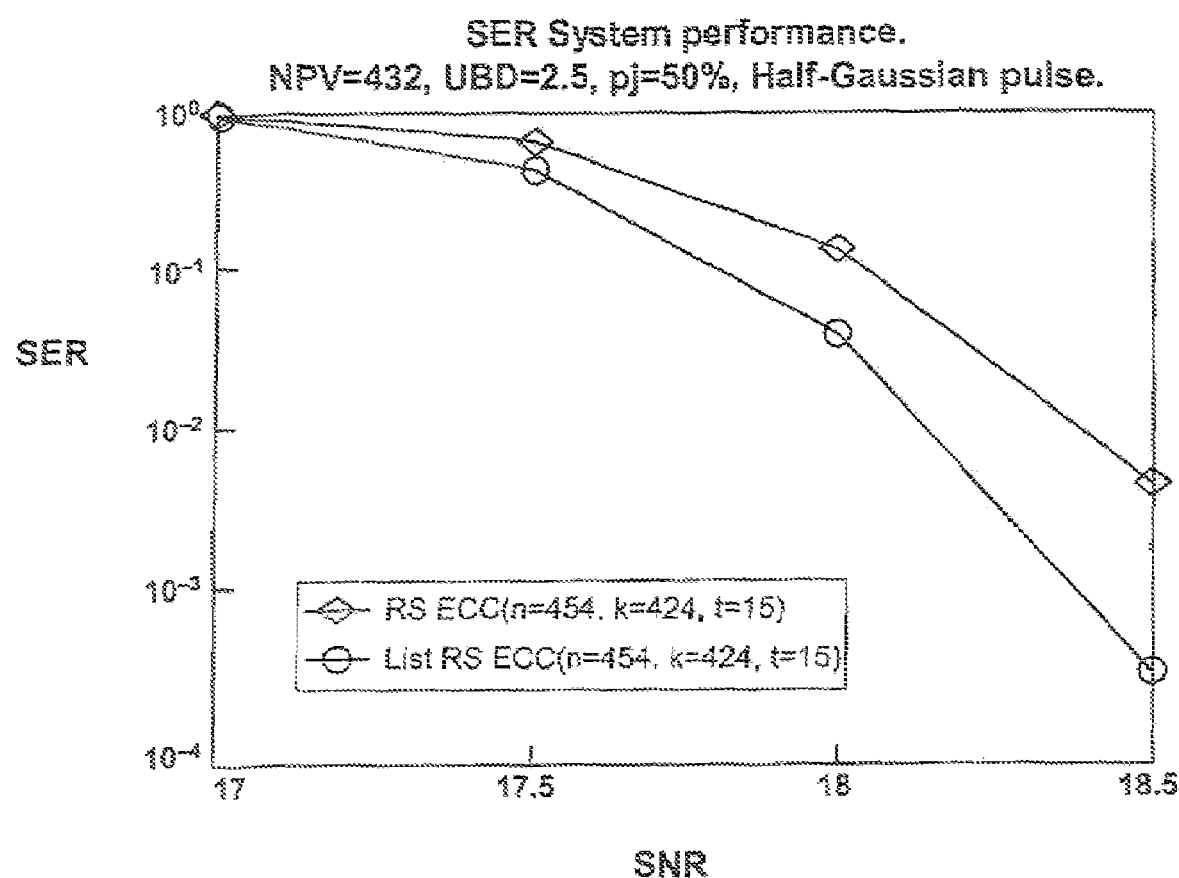
FIG. 7 is a diagram comparing the symbol error rate (SER) of a hard RS decoder with an RS decoder that utilizes a list of most-likely error events.

Shown in FIG. 7 is a graph comparing the performance of list RS decoders that use soft-information with RS decoders that do not. FIG. 7 shows that a list RS decoder that utilizes a list of most-likely error events has a lower symbol error rate (SER) than an RS decoder that does not use soft-information.

What has been described thus far are systems and methods for iteratively correcting the symbols of a decision-codeword if errors in the decision-codeword are of a degree that exceeds the correction capability of an error-correction code. The disclosed embodiments are exemplary and do not limit the scope of the disclosed technology. Other embodiments are also contemplated. For example, an error-correction system according to the disclosed technology can include RS decoders that are connected in different parallel and/or series configurations than those shown. Also, unless otherwise specified, the operations described as being performed by any particular element can be performed by a component of that element or can be performed by other elements.

What is claimed is:

1. A method of correcting errors in a decision-codeword by employing a Reed Solomon error-correction code RS(n,k) having a correction capability $t=(n-k)/2$, the method comprising:
   determining whether errors in the decision-codeword are of a degree that exceeds a Reed Solomon error-correction code's correction capability, by using an error indicator for the decision-codeword;
   modifying the decision-codeword to produce a modified decision-codeword if the degree of the errors exceeds the correction capability; and
   generating an error indicator for the modified decision-codeword using the error indicator for the decision-codeword.

2. The method of claim 1, wherein said modifying the decision-codeword to produce a modified decision-codeword comprises correcting one symbol in the decision-codeword.

3. The method of claim 1, further comprising correcting errors in the decision-codeword if the degree of the errors does not exceed the correction capability.

4. The method of claim 1, further comprising:
   modifying the decision-codeword to produce a second modified decision-codeword, if the degree of the errors exceeds the correction capability; and
   generating an error indicator for the second modified decision-codeword using the error indicator for the decision-codeword.

5. The method of claim 1, wherein said modifying the decision-codeword to produce a modified decision-codeword comprises:
   referring to an incidence vector to select an error event;
   referring to a list of error events to identify a symbol of the decision-codeword that corresponds to the error event; and
   correcting the symbol by replacing a value of the symbol with a next-most-likely value.

6. The method of claim 4, wherein said correcting the symbol comprises:
   referring to the list of error events to obtain a difference value associated with the symbol; and
   computing the next-most-likely value for the symbol by subtracting the difference value from the value of the symbol.

7. A method of correcting errors in a decision-codeword by employing a Reed Solomon error-correction code RS(n,k) having a correction capability $t=(n-k)/2$ and generating an error indicator for a modified decision-codeword using an error indicator for the decision-codeword, the method comprising:
   computing quotient polynomials $Q_A$, $Q_{xA}$, $Q_B$, $Q_{xB}$, $Q_{x^2B}$;
   computing remainder polynomials $r_A$, $r_{xA}$, $r_B$, $r_{xB}$, $r_{x^2B}$;
   computing quantities $d_1$, $d_2$, and $d_3$, where $$d_1 = \sum_{i=0}^{t} [S_{n-k-i}^{(e_l)}(Q_A)_i],$$

$$d_2 = \sum_{i=0}^{t} [S_{n-k-i}^{(e_l)}(Q_{xA})_i], \text{ and}$$

-continued $$d_3 = \sum_{i=0}^{t} \left[ S_{n-k-i}^{(e_l)}(Q_{xB})_i \right];$$

computing a quantity D=determinant $$\begin{bmatrix} r_{x\Lambda} & r_{xB} \\ d_2 & d_3 \end{bmatrix};$$

and
computing quantities a, b, and c, where $$a = (r_\Lambda d_3 + r_{xB} d_1) D^{-1},$$

$$b = \begin{cases} (d_1 + ad_2) d_3^{-1} & \text{if } d_3 \neq 0 \\ (r_\Lambda + ar_{x\Lambda}) r_{xB}^{-1} & \text{otherwise} \end{cases}; \text{ and}$$

$$c = r_\Lambda r_B^{-1}.$$

8. The method of claim 7, wherein said generating the error indicator for the modified decision-codeword further comprises:
computing syndromes for the modified decision-codeword, where there are (n−k) syndromes denoted as $S_0^{(e_l)}$, $S_1^{(e_l)}$, ..., $S_{(n-k-1)}^{(e_l)}$; and
generating the error indicator for the modified decision-codeword using at least some of the syndromes and at least one of: an error locator polynomial $\Lambda(x)$ for the decision-codeword and a scratch polynomial B(x) for the decision-codeword.

9. The method of claim 7, further comprising correcting one symbol in the decision-codeword to produce the modified decision-codeword and wherein the one symbol in the modified decision-codeword that was corrected is located at a position $i_l$ in the modified decision-codeword, and wherein the quotient polynomials are quotients resulting from dividing $\Lambda(x)$, $x\Lambda(x)$, B(x), xB(x), and $x^2B(x)$ by $x\alpha^{i_l}+1$.

10. The method of claim 7, further comprising correcting one symbol in the decision-codeword to produce the modified decision-codeword and wherein the one symbol in the modified decision-codeword that was corrected is located at a position $i_l$ in the modified decision-codeword, and wherein the remainder polynomials are remainders resulting from dividing $\Lambda(x)$, $x\Lambda(x)$, B(x), xB(x), and $x^2B(x)$ by $x\alpha^{i_l}+1$.

11. The method of claim 7, wherein said generating the error indicator for the modified decision-codeword further comprises:
computing an error locator polynomial $\Lambda^{(e_l)}(x)$ for the modified decision-codeword, where
$\Lambda^{(e_l)}(x)=\Lambda(x)+ax\Lambda(x)+bxB(x)$ if a degree of $\Lambda(x)$ is (n−k)/2, and
$\Lambda^{(e_l)}(x)=\Lambda(x)+axB(x)+bx^2B(x)$ if the degree of $\Lambda(x)$ is not (n−k)/2.

12. The method of claim 7, wherein said generating the error indicator for the modified decision-codeword further comprises:
computing a scratch polynomial $B^{(e_l)}(x)$ for the modified decision-codeword, where
$B^{(e_l)}(x)=\Lambda(x)+cB(x)$ if a degree of $\Lambda(x)$ is (n−k)/2, and
$B^{(e_l)}(x)=xB(x)+cB(x)$ if the degree of $\Lambda(x)$ is not (n−k)/2.

13. A system for correcting errors in a decision-codeword by employing a Reed Solomon error-correction code RS(n,k) having a correction capability t=(n−k)/2 and having means for generating an error indicator for a modified decision-codeword using an error indicator for the decision-codeword, the method comprising:
means for computing quotient polynomials $Q_\Lambda$, $Q_{x\Lambda}$, $Q_B$, $Q_{xB}$, $Q_{x^2B}$;
means for computing remainder polynomials $r_\Lambda$, $r_{x\Lambda}$, $r_B$, $r_{xB}$, $r_{x^2B}$;
means for computing quantities $d_1$, $d_2$, and $d_3$, where $$d_1 = \sum_{i=0}^{t} \left[ S_{n-k-i}^{(e_l)}(Q_\Lambda)_i \right],$$

$$d_2 = \sum_{i=0}^{t} \left[ S_{n-k-i}^{(e_l)}(Q_{x\Lambda})_i \right], \text{ and}$$

$$d_3 = \sum_{i=0}^{t} \left[ S_{n-k-i}^{(e_l)}(Q_{xB})_i \right];$$

means for computing a quantity $$D = \text{determinant} \begin{bmatrix} r_{x\Lambda} & r_{xB} \\ d_2 & d_3 \end{bmatrix};$$

and
means for computing quantities a, b, and c, where $$a = (r_\Lambda d_3 + r_{xB} d_1) D^{-1},$$

$$b = \begin{cases} (d_1 + ad_2) d_3^{-1} & \text{if } d_3 \neq 0 \\ (r_\Lambda + ar_{x\Lambda}) r_{xB}^{-1} & \text{otherwise} \end{cases}; \text{ and}$$

$$c = r_\Lambda r_B^{-1}.$$

14. The system of claim 13, wherein said means for generating the error indicator for the modified decision-codeword further comprises:
means for computing syndromes for the modified decision-codeword, where there are (n−k) syndromes denoted as $S_0^{(e_l)}$, $S_1^{(e_l)}$, ..., $S_{(n-k-1)}^{(e_l)}$; and
means for generating the error indicator for the modified decision-codeword using at least some of the syndromes and at least one of: an error locator polynomial $\Lambda(x)$ for the decision-codeword and a scratch polynomial B(x) for the decision-codeword.

15. The system of claim 13, further comprising means for correcting one symbol in the decision-codeword to produce the modified decision-codeword and wherein the one symbol in the modified decision-codeword that was corrected is located at a position $i_l$ in the modified decision-codeword, and wherein the quotient polynomials are quotients resulting from dividing $\Lambda(x)$, $x\Lambda(x)$, B(x), xB(x), and $x^2B(x)$ by $x\alpha^{i_l}+1$.

16. The system of claim 13, further comprising means for correcting one symbol in the decision-codeword to produce the modified decision-codeword and wherein the one symbol in the modified decision-codeword that was corrected is located at a position $i_l$ in the modified decision-codeword, and wherein the remainder polynomials are remainders resulting from dividing $\Lambda(x)$, $x\Lambda(x)$, B(x), xB(x), and $x^2B(x)$ by $x\alpha^{i_l}+1$.

17. The system of claim 13, wherein said means for generating the error indicator for the modified decision-codeword further comprises:

means for computing a error locator polynomial $\Lambda^{(ei)}(x)$ for the modified decision-codeword, where
$\Lambda^{(ei)}(x)=\Lambda(x)+ax\Lambda(x)+bxB(x)$ if a degree of $\Lambda(x)$ is $(n-k)/2$, and
$\Lambda^{(ei)}(x)=\Lambda(x)+axB(x)+bx^2B(x)$ if the degree of $\Lambda(x)$ is not $(n-k)/2$.

18. The system of claim 13, wherein said means for generating the error indicator for the modified decision-codeword further comprises:

means for computing a scratch polynomial $B^{(ei)}(x)$ for the modified decision-codeword, where
$B^{(ei)}(x)=\Lambda(x)+cB(x)$ if a degree of $\Lambda(x)$ is $(n-k)/2$, and
$B^{(ei)}(x)=xB(x)+cB(x)$ if the degree of $\Lambda(x)$ is not $(n-k)/2$.

19. A system for correcting errors in a decision-codeword by employing a Reed Solomon error-correction code $RS(n,k)$ having a correction capability $t=(n-k)/2$, in which an error indicator generation circuit that generates an error indicator for a modified decision-codeword using an error indicator for the decision-codeword, the error indicator generation circuit comprising:

a quotient computation circuit that computes quotient polynomials $Q_\Lambda$, $Q_{x\Lambda}$, $Q_B$, $Q_{xB}$, $Q_{x^2B}$;

a remainder computation circuit that computes remainder polynomials $r_\Lambda$, $r_{x\Lambda}$, $r_B$, $r_{xB}$, $r_{x^2B}$;

a circuit that computes quantities $d_1$, $d_2$, and $d_3$, where $$d_1 = \sum_{i=0}^{t} \left[ S_{n-k-i}^{(e_l)}(Q_\Lambda)_i \right],$$

$$d_2 = \sum_{i=0}^{t} \left[ S_{n-k-i}^{(e_l)}(Q_{x\Lambda})_i \right], \text{ and}$$

$$d_3 = \sum_{i=0}^{t} \left[ S_{n-k-i}^{(e_l)}(Q_{xB})_i \right];$$

a determinant computation circuit that computes a quantity $$D = \text{determinant}\begin{bmatrix} r_{x\Lambda} & r_{xB} \\ d_2 & d_3 \end{bmatrix};$$

and
a circuit that computes quantities a, b, and c, where $$a = (r_\Lambda d_3 + r_{xB}d_1)D^{-1},$$

$$b = \begin{cases} (d_1 + ad_2)d_3^{-1} & \text{if } d_3 \neq 0 \\ (r_\Lambda + ar_{x\Lambda})r_{xB}^{-1} & \text{otherwise} \end{cases}; \text{ and}$$

$$c = r_\Lambda r_B^{-1}.$$

20. The system of claim 19, wherein said error indicator generation circuit further comprises:

a syndrome computation circuit that computes syndromes for the modified decision-codeword, where there are $(n-k)$ syndromes denoted as $S_0^{(ei)}, S_1^{(ei)}, \ldots, S_{(n-k-1)}^{(ei)}$, where said error indicator generation circuit generates the error indicator for the modified decision-codeword using at least some of the syndromes and at least one of: an error locator polynomial $\Lambda(x)$ for the decision-codeword and a scratch polynomial $B(x)$ for the decision-codeword.

21. The system of claim 19, further comprising a symbol correction circuit that corrects one symbol in the decision-codeword and wherein the one symbol in the modified decision-codeword that was corrected is located at a position $i_l$ in the modified decision-codeword, and wherein the quotient polynomials are quotients resulting from dividing $\Lambda(x)$, $x\Lambda(x)$, $B(x)$, $xB(x)$, and $x^2B(x)$ by $x\alpha^{i_l}+1$.

22. The system of claim 19, further comprising a symbol correction circuit that corrects one symbol in the decision-codeword and wherein the one symbol in the modified decision-codeword that was corrected is located at a position $i_l$ in the modified decision-codeword, and wherein the remainder polynomials are remainders resulting from dividing $\Lambda(x)$, $x\Lambda(x)$, $B(x)$, $xB(x)$, and $x^2B(x)$ by $x\alpha^{i_l}+1$.

23. The system of claim 19, wherein said error indicator generation circuit further comprises:

an error locator polynomial computation circuit that computes a error locator polynomial $\Lambda^{(ei)}(x)$ for the modified decision-codeword, where
$\Lambda^{(ei)}(x)=\Lambda(x)+ax\Lambda(x)+bxB(x)$ if a degree of $\Lambda(x)$ is $(n-k)/2$, and
$\Lambda^{(ei)}(x)=\Lambda(x)+axB(x)+bx^2B(x)$ if the degree of $\Lambda(x)$ is not $(n-k)/2$.

24. The system of claim 19, wherein said error indicator generation circuit further comprises:

an error locator polynomial computation circuit that computes a scratch polynomial $B^{(ei)}(x)$ for the modified decision-codeword, where
$B^{(ei)}(x)=\Lambda(x)+cB(x)$ if a degree of $\Lambda(x)$ is $(n-k)/2$, and
$B^{(ei)}(x)=xB(x)+cB(x)$ if the degree of $\Lambda(x)$ is not $(n-k)/2$.

* * * * *